US005218210A

United States Patent [19]
McIntyre, Jr. et al.

[11] Patent Number: 5,218,210
[45] Date of Patent: Jun. 8, 1993

[54] BROAD BEAM FLUX DENSITY CONTROL

[75] Inventors: Edward K. McIntyre, Jr., West Roxbury; Victor M. Benveniste, Magnolia; Walter Hrynyk, Waltham, all of Mass.

[73] Assignee: Eaton Corporation, Cleveland, Ohio

[21] Appl. No.: 837,277

[22] Filed: Feb. 18, 1992

[51] Int. Cl.$^5$ .............................................. H01J 37/00
[52] U.S. Cl. ............................ 250/492.2; 250/423 R; 315/111.81
[58] Field of Search ............ 250/492.2, 492.21, 492.3, 250/423 R, 396 R, 398; 315/111.81; 313/360.1, 363.1

[56] References Cited

U.S. PATENT DOCUMENTS

| | | | |
|---|---|---|---|
| 4,562,355 | 12/1985 | Keller et al. | 250/423 R |
| 4,883,968 | 11/1989 | Hipple et al. | 250/423 R |
| 4,914,305 | 4/1990 | Benveniste et al. | 250/492.3 |
| 4,952,843 | 8/1990 | Brown et al. | 250/423 R |
| 5,017,835 | 5/1991 | Oechsner | 250/423 R |
| 5,023,458 | 6/1991 | Beneveniste et al. | 250/396 R |
| 5,089,746 | 2/1992 | Rosenblum et al. | 250/423 R |

Primary Examiner—Paul M. Dzierzynski
Assistant Examiner—Kiet T. Nguyen
Attorney, Agent, or Firm—Watts, Hoffmann, Fisher & Heinke

[57] ABSTRACT

An ion beam source. The source includes multiple apertures bounded in close proximity by an extraction electrode for extracting positively charged ions from the source. Ions exiting the source combine downstream to form a broad beam which, in one utilization of the invention, is used for ion beam treatment of a silicon wafer. Individual electrodes in close proximity to the extraction electrode can be biased to either inhibit or allow backstreaming of neutralizing electrons from beam portions close to the source back to the extraction electrode. This allows the beam portion to become deneutralized and, therefore, unstable. The unstable beam is diminished in intensity since positively charged ions within that beam portion exit the beam. An isolation plate separates beam portions in close proximity to the extraction electrode to inhibit beam crosstalk and an additional suppression electrode common to all beam portions is controllably biased to further enhance control over beam portion intensity. In a typical application, the beam is a circular beam and intensity control is maintained to assure common intensity for a given radii from the beam center.

8 Claims, 6 Drawing Sheets

BROAD BEAM FLUX DENSITY CONTROL

FIELD OF THE INVENTION

The present invention concerns an ion beam system for treating a workpiece, and more particularly concerns an ion beam implantation system wherein the ion beam is made up of multiple beam portions which combine to create a broad beam whose intensity distribution can be controlled by modulating the beam portions.

BACKGROUND ART

U.S. Pat. No. 5,023,458 to Benveniste et al. concerns an ion beam control system. The '458 patent discloses an ion implantation source that emits ions from multiple apertures to produce multiple beam portions which combine to form a large diameter beam. One goal of the '458 patent is to generate an ion beam approximately the size of a workpiece from multiple beam portions which can be turned on and off in a controlled fashion to control beam intensity. This was accomplished by controlling beam neutralization of the ion beam as a function of position within the cross section of the beam. The disclosure of the '458 patent to Benveniste et al. is incorporated herein by reference.

In an ion beam implanter of the type disclosed in the '458 Benveniste et al. patent, neutralization of the beam is achieved by interaction between ions within the beam and a residual gas along the beam transport line. Beam ions ionize the residual gas and liberate electrons having a low energy that are captured within the potential well of the beam. Slow residual gas ions are expelled from the beam. The space charge of the beam is neutralized by the low-energy electrons and this enables the beam to be transported from a source to a workpiece without significant loss in beam definition. Since ion beam transport is dependent upon the presence of low-energy neutralizing electrons, it is important to assure electrons are not unintentionally extracted from the ion beam during beam transport.

Prior art ion beam sources have an extraction electrode for attracting positively charged ions from an ion source. A suppression electrode biased at a slight negative potential prevents passage of neutralizing electrons from the ion beam back to the highly positive extraction electrode. But for the presence of the suppression electrode, the neutralizing electrons would be drawn back to the extraction electrode, thus deneutralizing the beam and causing beam blow-up.

DISCLOSURE OF THE INVENTION

Apparatus constructed in accordance with one embodiment of the present invention is used to control ion beam intensity in a broad beam ion implanter. An ion source creates ions within a confined region and includes a wall bounding the confined region having multiple exit apertures that allow ions to exit the confined region and form ion beam portions. The ion beam portions combine to form an ion beam having a beam cross section greater than that of the individual beam portions.

Located in proximity to the multiple exit apertures are extraction electrodes including a conductive extraction plate maintained at an electric potential that attracts ions from the source. A beam intensity control includes multiple suppression electrodes. The electric potential on the suppression electrodes is controlled to allow selective backstreaming of electrons from beams portions exiting the conductive extraction plate. By individually activating these electrodes in a controlled fashion, the ion beam intensity across the broad beam can be adjusted and controlled to make the intensity more uniform or to impose controlled intensity variations across the ion beam cross section.

In accordance with an additional aspect of the invention, individual beam segments are separated from each other downstream from the suppression electrodes to inhibit crosstalk between adjacent beam portions. This facet of the invention inhibits beam deneutralization of one beam portion due to a net space charge of an adjacent beam portion.

One object of the invention is selective control over ion beam intensity in a broad beam ion implanter. This and other objects, advantages and features of the invention can be more completely understood from a detailed description of a preferred embodiment of the invention which is described in conjunction with the accompanying drawings.

BEST MODE FOR PRACTICING THE INVENTION

Figure 1:
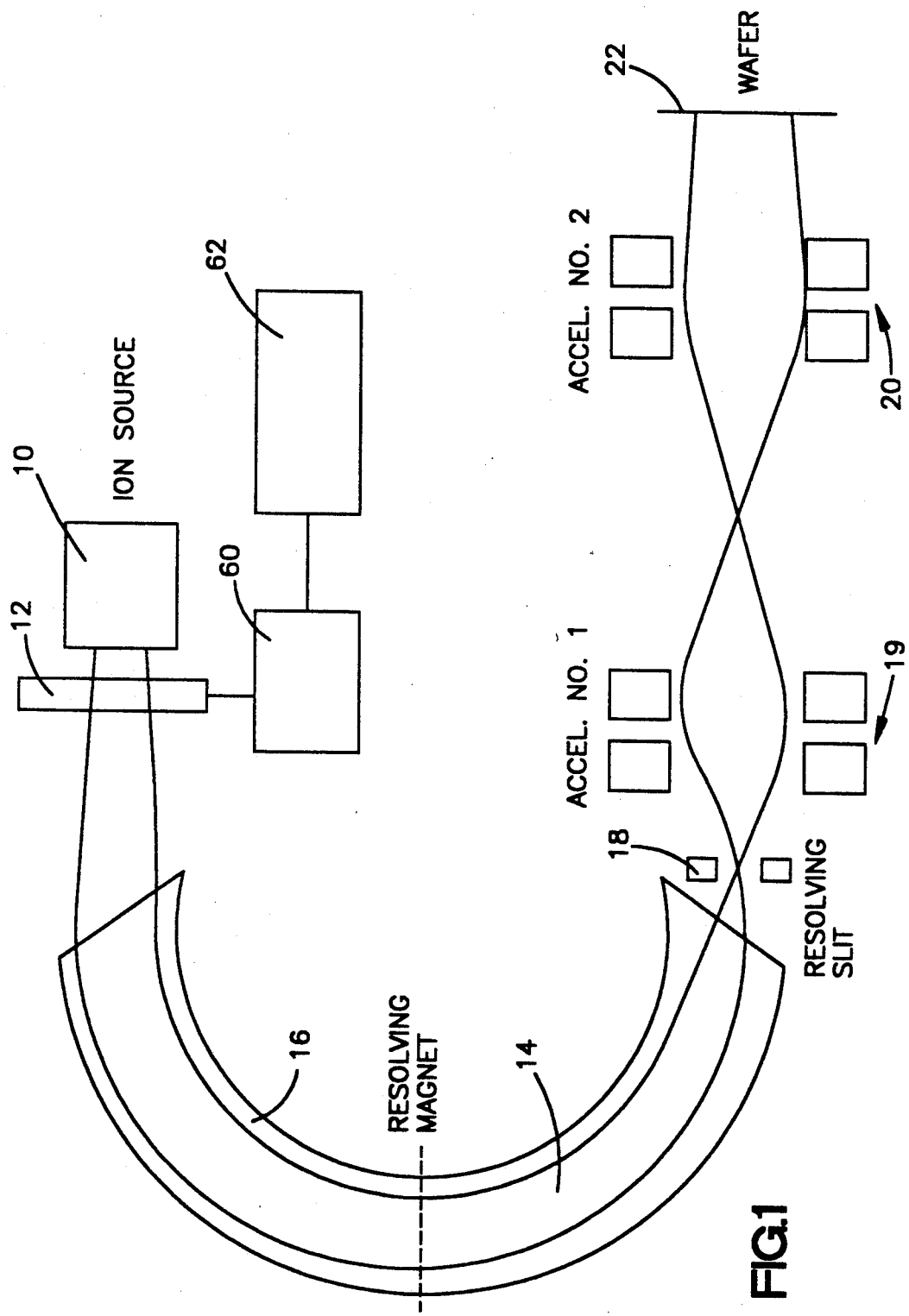
FIG. 1 is a schematic depiction of an ion implantation system for treating a workpiece.

Turning now to the drawings, FIG. 1 depicts an on implantation system including a low energy (2 kv) ion source 10 for emitting ions whose intensity is controlled by an electrode assembly 12. The source 10 emits a plurality of small cross section beams that gradually lose their definition and diffuse as they move along a travel path. This diffusion allows individually emitted beam portions from the source 10 to combine and form a beam 14 that is wider than any of the beam portions. The ion intensity within the cross section of the ion beam 14 is controlled by removing neutralizing electrons from a given beam portion before it diffuses into the combined beam 14.

The ion beam 14 passes through an analyzing or resolving magnet 16 where the ions in the beam are bent in a manner dependent upon their mass and charge. Downstream from the resolving magnet 16, the beam 14 enters a metal resolving slit 18 that defines a beam waist in a dispersive plane. Those ions passing through the resolving slit 18 are further accelerated by two accelerating tubes 19, 20 which accelerate the ions to a desired energy level (between 5 and 200 kv) and project the beam onto a workpiece 22. The two accelerating tubes 19, 20 act as a telescope and by controlling the size of the accelerating energy and distance along the beam path between the two tubes 19, 20 the size and angle of beam impact on the workpiece 22 are controlled.

One typical use of the invention is for doping silicon wafers that constitute the workpiece 22. In this application the wafer 22 is moved to and from a proper position and orientation in the ion beam 14 by automatic wafer handling apparatus. Since the beam 14 is in a highly evacuated chamber from the source to the region of the wafer 22, this apparatus must move the wafers from atmospheric to very low pressure. Apparatus for accomplishing this task is known in the prior art.

No wafer scanning at the implantation station is needed since the source 10 produces a beam 14 of large enough cross section to treat the implantation surface of the workpiece 22. Additionally, no scanning electrodes are needed and therefore the electronics needed to adjust the voltage on such electrodes are avoided.

In accordance with one embodiment of the invention, the source 10 is a multi-aperture Kaufman-type source capable of producing ions having an energy of approximately 1 kilovolt and currents of approximately 10 milliamps per square centimeter.

In the merged beam arrangement depicted in FIG. 1, the magnet 16 helps focus the individual beam portions into a single merged beam which is resolved through the single slit 18 and is then accelerated as a single beam. Certain advantages accompany use of this merged beam technique over a technique where each of the beam portions are resolved and accelerated. The resolving magnet gap is kept small since the source 10 itself is smaller in cross section. The common resolving slit 18 is easier to accomplish than would be multiple slits, one for each individual beam portion. Resolving and ion acceleration are achieved more easily since duplicate acceleration electrodes for each beam portion are not needed. In addition, the simplicity of the post acceleration apparatus results in fewer surfaces to accumulate condensates.

Figure 3:
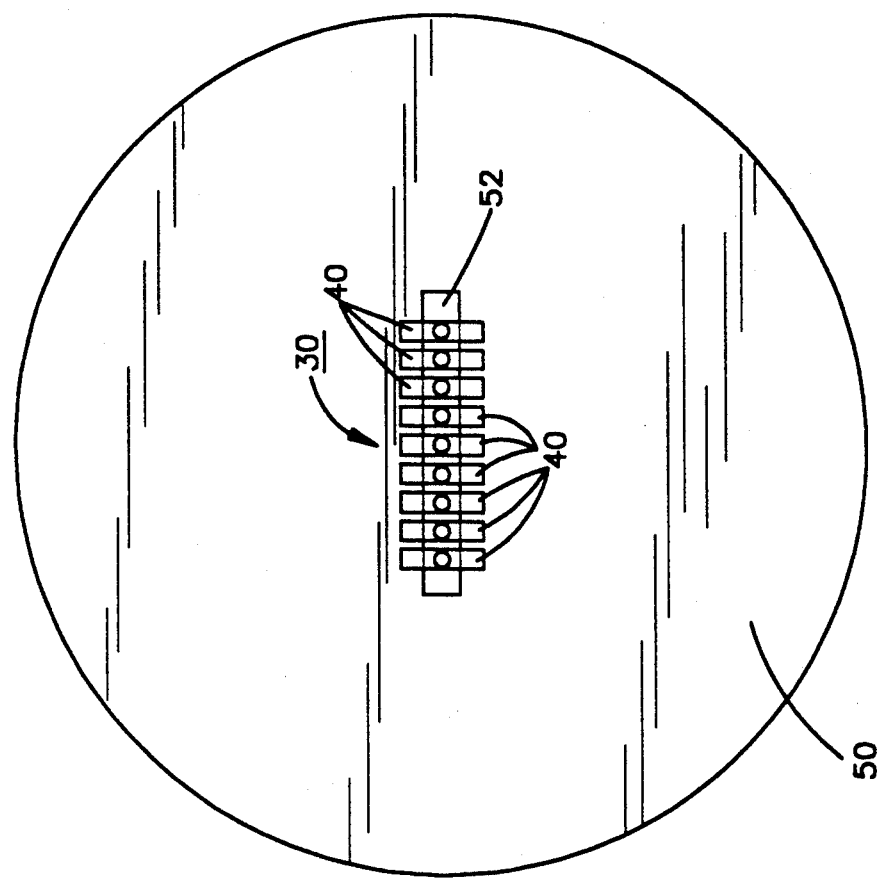
FIG. 3 is a plan view of control electrode structure in proximity to the FIG. 2 source showing an array of ion intensity control electrodes.
Figure 2:
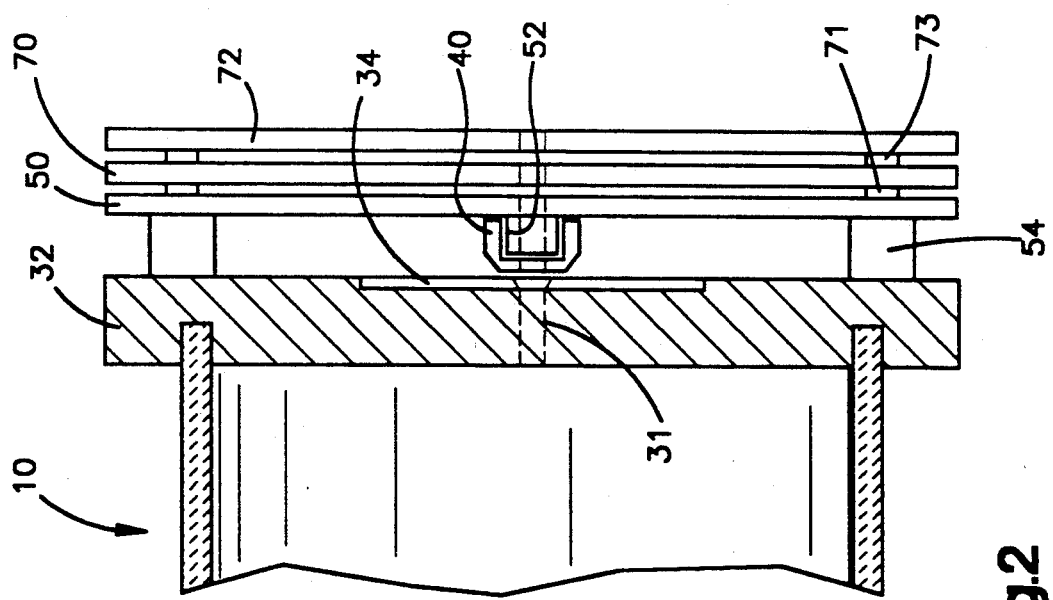
FIG. 2 is a partially sectioned view showing an ion beam source.

FIGS. 2 and 3 depict the source 10 and electrode assembly 12. An array 30 of nine aligned exit apertures 31 is defined by a wall 32 of the ion source 10. The source 10 is generally cylindrical and is bounded by insulating side walls that in a preferred embodiment are constructed from quartz. The wall 32 is metallic and preferably constructed from aluminum. An ion plasma exists within the confines of the ion source 10 and ions within the plasma naturally migrate to the vicinity of exit apertures within the wall 32. A metal extraction electrode 34 is supported by the wall 32 and biased at an electrical potential of +2 to +5 kilovolts with respect to ground and creates an electric field in the vicinity of the source 10 that causes ions in the plasma to be accelerated through the extraction electrode 34 and exit the source 10. This results in the formation of multiple small cross section beam portions that combine with each other to form the beam 14.

The extraction electrode 34 of FIG. 2 defines an array of nine apertures that align with a corresponding array of apertures formed in the wall 32. Each of the openings defined by the extraction electrode 34 has a suppression electrode 40 whose electric potential can be individually controlled. When a suppression electrode 40 is grounded, electrons within an associated beam portion backstream to the electrode 34 and thereby create a net positive charge per unit volume within the beam portion. This results in a rapid destabilization of the beam portion due to repulsion between ions. This occurs within a very short distance downstream from the electrode 40 and results in a diminished contribution from that beam portion within the resultant ion beam 14.

In the field of ion doping of silicon wafers, it is typically desirable to produce a broad beam having a controllable distribution of current density. In the case where a highly uniform beam is desired, this requires that in moving from the center of the beam to its edge (in a circular geometry), the beam current density remains constant for some range of radii. One technique to achieve such constant intensity would be to impose a predetermined dead-time on each individual beam portion during a set duty cycle. This turning on and off of the beam portion in a correct proportion allows the beam current density of an entire ring of beam portions to be made uniform. Such a dead-time or off period is easily calculated if there is little or no interaction between beam portions as they are individually switched on and off.

Figure 4:
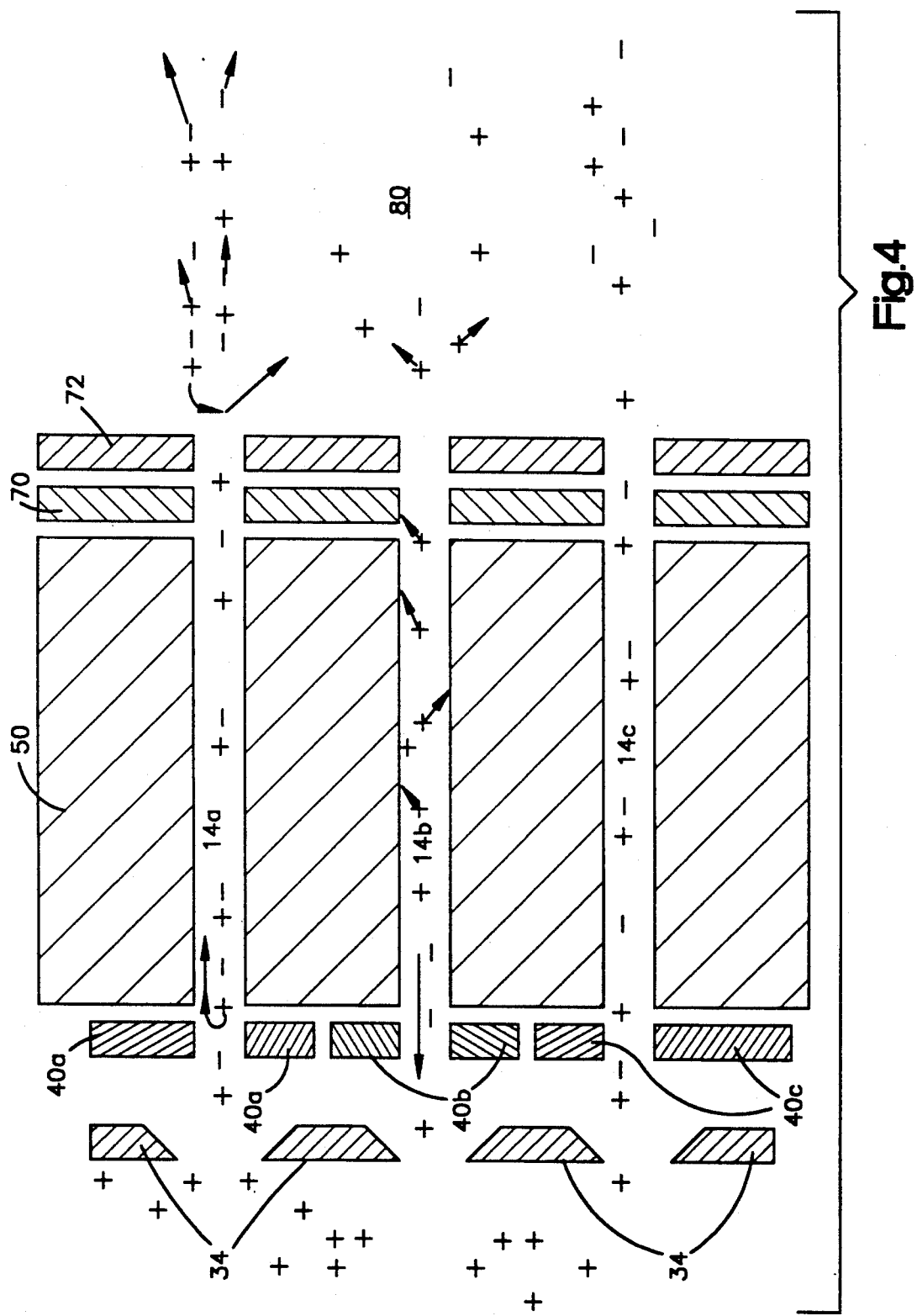
FIG. 4 is a section view showing three adjacent apertures emitting ions and structure to control ion beam intensity by selective energization of intensity control electrodes.

FIG. 4 illustrates a portion of the electrode assembly 12 for achieving controlled individual beam portion intensity that avoids beam interaction between adjacent beam portions, yet allows individual control over beam portion intensity. FIG. 4 depicts a common extraction electrode 34 and three individually controllable suppression electrodes 40a, 40b, 40c.

Adjacent these suppression electrodes is a plate 50 which supports the electrodes 40 and is spaced from those electrodes by an insulating standoff 52. The plate 50 defines an exit channel or passageway for each of the three beam portions depicted in FIG. 4 and is grounded to provide electrical isolation between beam portions. The plate 50 is coupled to the wall 32 by insulating standoffs 54.

The suppression electrodes 40a, 40b, 40c inhibit backstreaming of electrons to the extraction electrode when biased below ground by a power supply 60 coupled to a programmable controller 62 (FIG. 1). When the potential on the middle electrode 40b rises to ground potential, electrons in a beam portion 14b are attracted to the extraction electrode 34 causing the beam portion 14b to become positively charged. The positively charged ions within the beam portion 14b repulse each other and are directed away from their original path against walls of the plate 50. When the electrode 40b is returned to its negative voltage, beam neutralization is rapidly reinstituted to cause a low angular divergence of ions within the beam portion 14b.

But for the presence of the plate 50, when the beam portion 14b (for example) is deneutralized, it would attract electrons from adjacent beam portions causing those beam portions to be partially deneutralized and thereby diminishing control over individual beam portion intensity. Due to the presence of the plate 50, however, neutralizing electrons in adjacent beam portions are shielded from the increased beam potential of the deneutralized beam portion by the grounded walls of the channel.

The flux density within the beam is controlled by imposing a duty cycle of, for example, 10 milliseconds. During this duty cycle, an individual suppression electrode is switched off for a fraction of the duty cycle. The larger the fraction of the duty cycle during which the beam portion is attenuated, the lower the ion intensity for that portion.

Downstream from the grounded plate 50 is a second suppression electrode 70 electrically isolated from the plate 50 by an insulating standoff 71 which is maintained at a constant negative potential with respect to ground. A second grounded electrode 72 located further downstream along the ion beam path and separated from the electrode 70 by an insulating standoff 73 allows the individual beam portions to exit a uniform potential region and continue onto the resolving magnet 16.

Figure 5A:
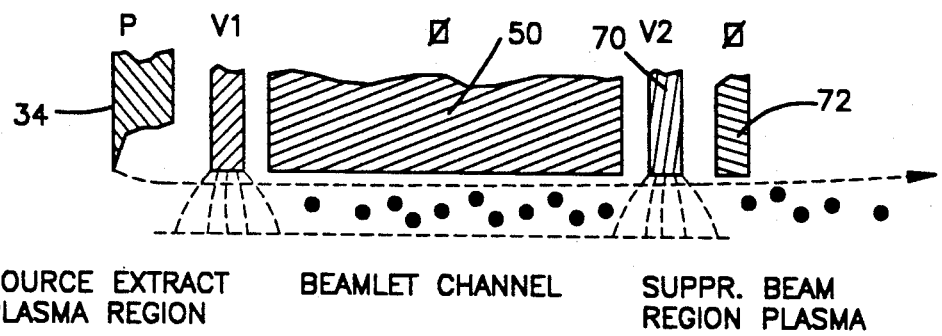
FIG. 5A is a schematic depiction of structure for controlling beam intensity of one beam portion.
Figure 5B:
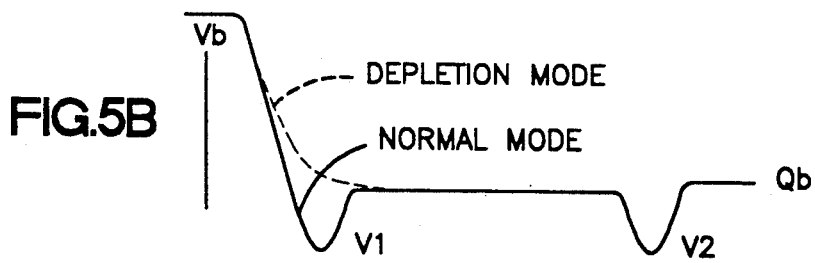
FIG. 5B is a graph showing electric potentials in the vicinity of the FIG. 5A structure.

FIG. 5B illustrates the electric potential in the region of the electrode assembly shown in FIG. 5A. By selectively grounding (and thus raising the electric potential of) the first suppression electrode, electrons within the channel are attracted upstream to the extraction electrode 34 due to the high positive potential maintained on this electrode. When the potential (V1) of the suppression electrode is reduced below ground, electrons remain within the ion beam portion surrounded by the plate 50 to maintain beam neutrality.

By applying a negative voltage to the second suppression electrode 70 of a magnitude comparable to the voltage on the first suppression electrode 40b, it is possible to inhibit the passage of electrons from an overlap region 80 downstream from the electrode assembly 12 back to the high-voltage extraction electrode 34. Since the second suppression electrode 70 is common to all channels or beam portions, when a given suppression electrode is biased to zero potential, only the channel inside the plate 50 associated with the grounded suppression electrode is stripped of its electrons. Neutralization electrons within adjacent beam portions are shielded from the increased beam potential by the grounded walls of the metallic channel through which the strip beam portion passes. The final grounded electrode 72 terminates the electric field of the electrode assembly 12 and thereby diminishes the interaction between the electrode assembly and the overlap portion 80 of the beam 14.

Figure 6:
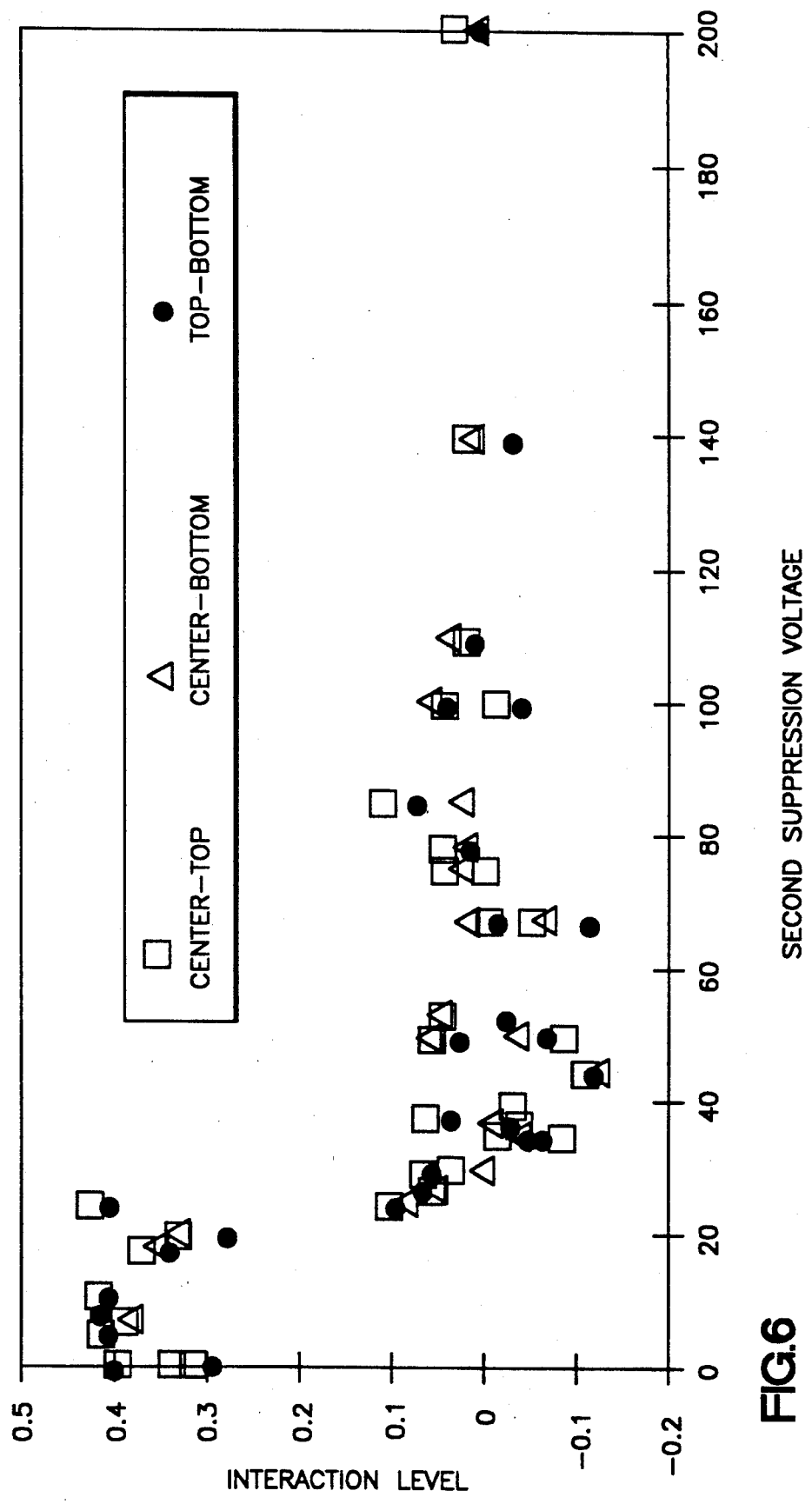

Operating characteristics of the source 10 are summarized in the graphical depictions of FIGS. 6–9. In FIG. 6, the beam interaction between adjacent beam portions is plotted as a function of the voltage maintained on the second suppression electrode 70. The ordinate corresponds to an arbitrary scale wherein large values indicate significant ion beam interaction between beam portions. The data is plotted for three apertures designated center, top and bottom which corresponds, for example, to the three channels shown in FIG. 4. The data plotted with a square box, for example, shows the amount of interaction between the top and center suppression electrodes 40a, 40b. Similarly, data in which the center and bottom suppression electrodes 40b, 40c are biased at the same potential, is plotted with a triangle.

The data shown in FIG. 6 suggests that the second suppression electrode 70 should be biased to a certain level to assure low interaction between adjacent beam portions. When the second suppression electrode falls below 20-25 volts (negative), the beam portion interaction increases significantly and control over total beam intensity distribution is impeded. There is less interaction when the voltages are maintained at a value between 20–80 volts and the most desirable voltage on the second suppression electrode 70 is above 80 volts. The data depicted in FIG. 6 is for an extraction electrode biased at 5 kilovolts.

Figure 9:
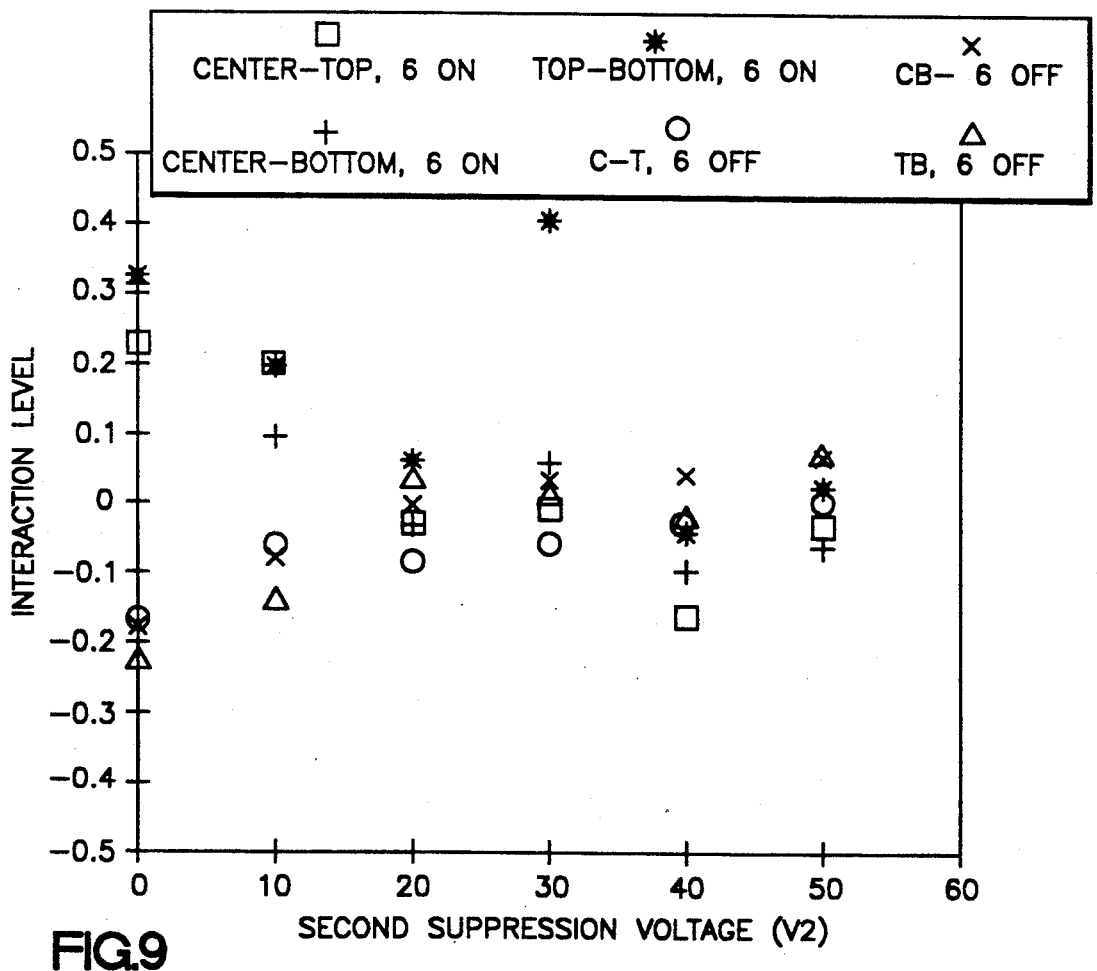
FIGS. 6-9 are graphs illustrating the degree to which beam intensity for individual beam portion can be controlled without undue interaction with adjacent beam portions.

Similar data is depicted in FIG. 9. This data corresponds to a 3-kilovolt extraction voltage and a 9-hole array 30. The coordinates are again suppression voltage and interaction level, and the controls designated in the legend indicate interaction between non-adjacent holes. As an example, the square data plots correspond to the interaction between the middle beamlet from the top three holes and the middle beamlet of the central three holes. In this case, the middle beamlet of the bottom three holes and the six interspersed holes have the standard suppression electrode voltage. The data in FIG. 9 suggests that, for lower extraction voltages, the biasing of the suppression electrode 70 can be diminished without degrading beam intensity control due to beam interaction.

Figure 8:
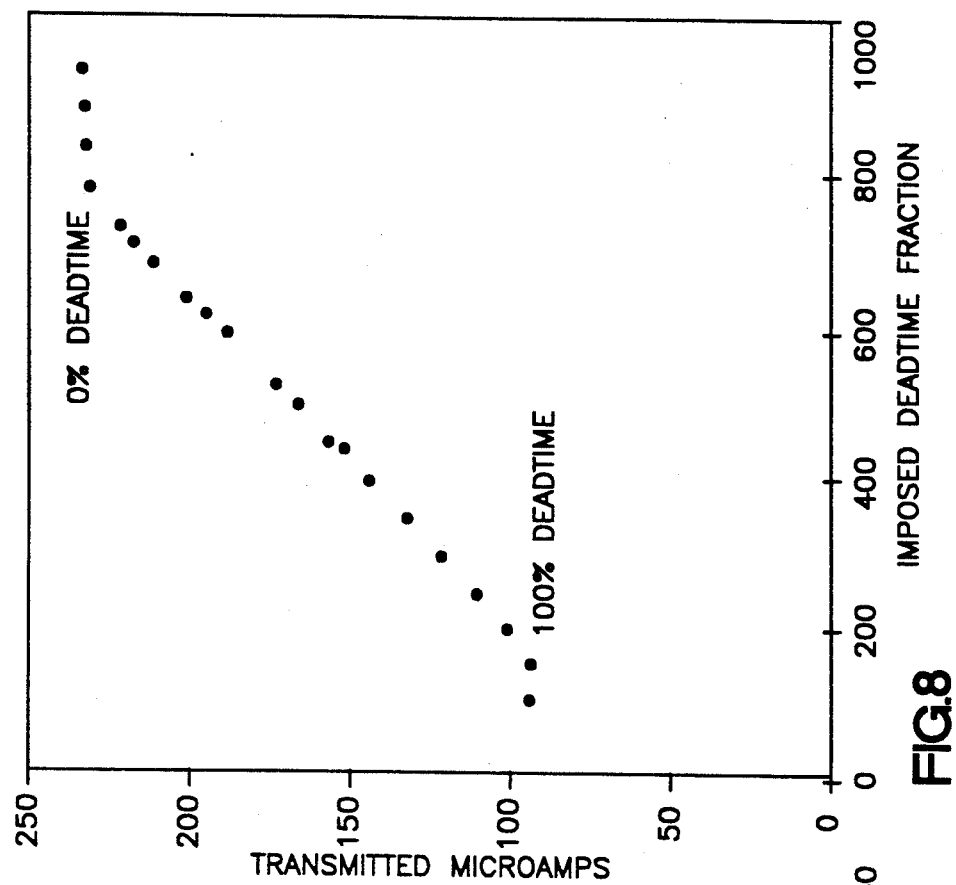
Figure 7:
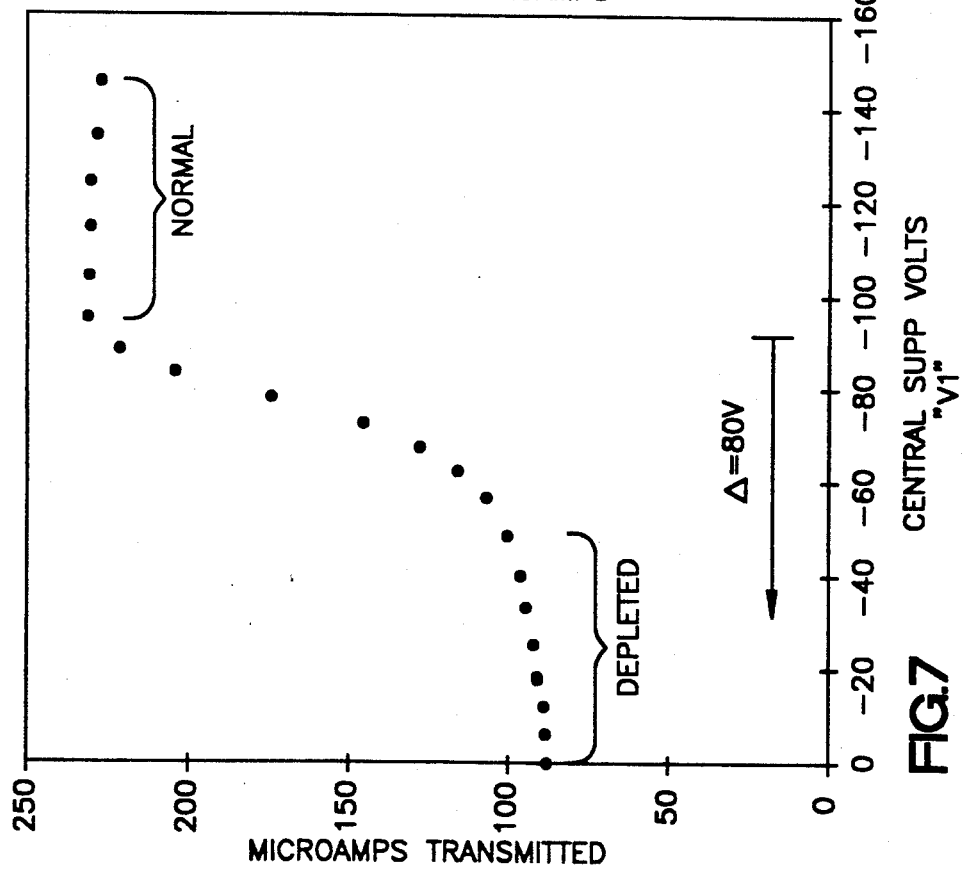

FIGS. 7 and 8 depict the degree of control achievable by control of individual suppression electrodes. The FIG. 7 graph depicts voltage with respect to ground of one of the suppression electrodes (40b for example) and the transmitted beam current for the beam portion associated with the electrode. As seen in FIG. 7, as the suppression voltage approaches zero (ground potential) the backstreaming of electrons to the extraction electrode 34 increases and beam current drops. Biasing the suppression electrode 80 volts below ground impedes electron backstreaming and allows a maximum ion beam current.

FIG. 8 is a graph showing transmitted current as a function of duty cycle imposed upon the suppression electrode. A zero percent dead-time corresponds to a situation in which a constant suppression voltage is imposed. A 100 percent dead-time corresponds to the situation in which the depletion electrode is always held at a ground potential. As seen in the Figure, the relation between transmitted current and duty cycle is a linear relationship, allowing accurate control over the beam intensity by adjustment of the imposed duty cycle on the depletion electrode.

The linear array of nine apertures would most typically be replaced by a two dimensional array of apertures such as the array depicted in U.S. Pat. No. 5,023,458 to Benveniste et al. A linear array could be used, however, in applications where linear traversals of the workpiece 22 through the beam 14 are accomplished by a suitable wafer drive mechanism. It is the intent that the invention include all modifications and alterations from the disclosed design falling within the spirit or scope of the appended claims.

We claim:

1. A method for forming an ion beam comprising the steps of:
   a) creating a plasma of ions within a region bounded by a wall having multiple exit apertures therein;
   b) extracting ions from within the region by biasing one or more extraction electrodes in the vicinity of the exit apertures to accelerate ions through the apertures and form multiple ion beam segments which combine to form the ion beam;
   positioning multiple suppression electrodes outside the region bounded by the wall;
   c) attracting charged particles from the ion beam segments back to the extraction electrodes to controllably attenuate selected beam segments and thereby control the ion beam intensity as a function of position within the ion beam by biasing the suppression electrodes at electric potentials that allow backstreaming of the charged particles to the extraction electrodes; and
   d) electrically isolating adjacent beam segments to control removal of charged particles from said adjacent beam segments by routing the multiple ion beam segments through beam isolating means to suppress crosstalk between beam segments after they pass the suppression electrodes.

2. The method of claim 1 wherein the biasing step is performed by applying a cyclic voltage to each suppression electrode and controlling a duty cycle of the cyclic voltage between a voltage that allows backstreaming of charged particles and a voltage that inhibits said backstreaming.

3. Apparatus comprising:
a) an ion source for creating ions within a confined region and including a wall bounding the confined region having multiple exit apertures that allow ions to exit the confined region and form ion beam portions; said ion beam portions combining to form an ion beam having a beam cross section greater than that of the individual beam portions;
b) extraction means comprising a conductive extraction plate maintained at an electric potential for attracting ions from the ion source, said conductive extraction plate including multiple extraction apertures aligned with the multiple exit apertures in the wall of said ion source to allow ions exiting the confined region to pass through the extraction plate;
c) beam intensity control means including suppression electrodes for inhibiting backstreaming of electrons from beam portions exiting the conductive extraction plate and biasing means for individually controlling a potential on said suppression electrodes and thereby control electron backstreaming to adjust beam density across the beam cross section; and
d) beam separation means downstream from the suppression electrodes for inhibiting electrical interaction between beam portions that have been deneutralized due to electron backstreaming.

4. The apparatus of claim 3 where the beam separation means comprises:
a) a metallic isolation plate held at one electric potential; and
b) an electrode downstream from the isolation plate biased at a second fixed electric potential to inhibit movement of electrons through the isolation plate.

5. In an ion implantation system, apparatus for directing an ion beam along a controlled trajectory to impact a wafer comprising:
a) ion source means for providing a plurality of relatively small cross section ion beams which combine to form a larger ion beam having a beam cross section on the order of the area of a wafer surface to be treated;
b) ion distribution control means including a plurality of spaced electrodes for deneutralizing charge in selected small cross section ion beams by attracting charged beam neutralizing particles from said selected small cross section ion beams;
c) beam separation means for electrically isolating the small cross section ion beams from each other to inhibit electrical attraction between generally charge neutral small cross section ion beams and closely adjacent deneutralized small cross section ion beams;
d) analyzing means for analyzing ions leaving the ion distribution control means and for directing certain ions to follow a wafer treatment trajectory;
e) a wafer treatment station for placing wafers in a position to intercept said certain ions after said ions exit the analyzing means; and
f) switching means coupled to the ion distribution control means for individually controlling biasing potentials of the spaced electrodes to provide a controlled ion distribution of ions impacting a wafer surface at the wafer treatment station.

6. The ion implantation system of claim 5 additionally comprising a power supply means for electrically biasing the spaced electrodes at individual control potentials.

7. In an ion implantation system, apparatus for directing an ion beam along a controlled trajectory to impact a wafer comprising:
a) ion source means for providing a plurality of relatively small cross section ion beams which combine to form a larger ion beam having a beam cross section on the order of the area of a wafer surface to be treated;
b) ion distribution control means including a plurality of spaced electrodes for deneutralizing charge in selected small cross section ion beams by attracting charged beam neutralizing particles from said selected small cross section ion beams;
c) beam separation means for electrically isolating the small cross section ion beams from each other to inhibit electrical attraction between generally charge neutral small cross section ion beams and closely adjacent deneutralized small cross section ion beams;
d) analyzing means for analyzing ions leaving the ion distribution control means and for directing certain ions to follow a wafer treatment trajectory;
e) a wafer treatment station for placing wafers in a position to intercept said certain ions after said ions exit the analyzing means; and
f) switching means coupled to the ion distribution control means for individually controlling biasing potentials of the spaced electrodes to provide a controlled ion distribution of ions impacting a wafer surface at the wafer treatment station
the beam separation means comprising an isolation plate having channels extending therethrough held at a fixed electric potential and a suppression electrode downstream from the isolation plate biased at a potential for inhibiting movement of neutralizing particles into the channels of the isolation plate.

8. The ion implantation system of claim 7 additionally comprising an additional plate held at the potential of the isolation plate and located downstream from the suppression electrode.

* * * * *